(12) United States Patent
Xue et al.

(10) Patent No.: US 8,030,654 B2
(45) Date of Patent: Oct. 4, 2011

(54) THIN FILM TRANSISTOR AND METHOD OF MANUFACTURING THE SAME

(75) Inventors: Jianshe Xue, Beijing (CN); Seung Moo Rim, Beijing (CN); Ke Liang, Beijing (CN)

(73) Assignee: Beijing Boe Optoelectronics Technology Co., Ltd. (CN)

( * ) Notice: Subject to any disclaimer, the term of this patent is extended or adjusted under 35 U.S.C. 154(b) by 654 days.

(21) Appl. No.: 12/061,425

(22) Filed: Apr. 2, 2008

(65) Prior Publication Data

US 2008/0303028 A1  Dec. 11, 2008

(30) Foreign Application Priority Data

Jun. 8, 2007 (CN) .......................... 2007 1 0100342

(51) Int. Cl.
*H01L 29/76* (2006.01)
*H01L 31/36* (2006.01)
*H01L 31/112* (2006.01)

(52) U.S. Cl. .............. 257/66; 257/59; 257/72; 257/547; 257/E21.414; 257/E29.147

(58) Field of Classification Search .................... 257/66, 257/59–72, 547, E21.414, E29.147
See application file for complete search history.

(56) References Cited

U.S. PATENT DOCUMENTS

| 2001/0007358 A1 | 7/2001 | Nakahori et al. |
| 2008/0121890 A1* | 5/2008 | Yang et al. ...................... 257/66 |

FOREIGN PATENT DOCUMENTS

| CN | 1466017 A | 1/2004 |
| JP | 1993-315616 A | 11/1993 |
| KR | 1999-030267 A | 4/1999 |
| KR | 10-0336890 B1 | 6/2003 |
| KR | 10-0615205 B1 | 8/2006 |

\* cited by examiner

*Primary Examiner* — Cuong Q Nguyen
*Assistant Examiner* — Cathy N Lam
(74) *Attorney, Agent, or Firm* — Sheridan Ross P.C.

(57) ABSTRACT

A thin film transistor comprising a gate electrode, a gate insulating layer, an active layer, and source and drain electrodes is provided. The gate electrode overlaps with a channel region of the active layer, the gate insulating layer is provided between the gate electrode and the active layer, the source and drain electrodes overlap a source region and a drain region of the active layer, respectively, and a thin film of $SiN_x$ or $SiO_xN_y$ through which electrons are allowed to tunnel is provided between the active layer and the source and drain electrodes.

10 Claims, 2 Drawing Sheets

THIN FILM TRANSISTOR AND METHOD OF MANUFACTURING THE SAME

FIELD OF THE INVENTION

The present invention relates to a thin film transistor, a method of manufacturing a thin film transistor, and a thin film transistor liquid crystal display (TFT-LCD) employing the thin film transistor.

BACKGROUND OF THE INVENTION

Thin film transistors (TFTs) are used in a liquid crystal display (LCD) as switching elements for pixel units. Currently, a bottom gate TFT structure as shown in FIG. 1 is generally employed by most of the manufacturers of TFT-LCDs. The structure mainly comprises the following layers: a glass substrate 100 and a gate 200, a gate insulating layer 300, a semiconductor layer 400, a doped semiconductor layer 500, source and drain electrodes 700, a passivation layer 800, and a pixel electrode 900, which are formed on the glass substrate 100 in order from the bottom. The manufacturing processes of the bottom gate TFT are outlined as follows:

1. A metal thin film is deposited on a substrate (e.g., a glass or a single crystal silicon wafer) by magnetic sputtering, and then a pattern of a gate line and a gate electrode is formed by photolithography and etching. Conventionally, the target material for depositing the metal thin film normally comprises Al and Al alloy, and other metals and alloys may also be used when an integrated circuit (IC) is prepared.

2. A $SiN_x$ or $SiO_xN_y$ thin film layer is prepared by chemical vapor deposition (CVD) as a gate insulating layer. The semiconductor layer (e.g., an a-Si layer) and the doped semiconductor layer (e.g., an $N^+$ a-Si layer) are deposited in a same process on the gate insulating layer by CVD. The semiconductor layer and the doped layer are patterned to form a silicon island and a channel region by photolithography and dry etching.

3. A metal layer is deposited on the doped semiconductor layer by magnetic sputtering, and source and drain electrodes and a data line are formed by photolithography and etching. The materials for the source and drain electrodes and the date line comprise metals of high melting temperature, such as Mo, Cr, Ti, or MoW, or alloys thereof, and the formed source and drain electrodes are in good ohmic contact with the doped semiconductor layer, respectively.

4. A passivation layer (e.g., a SiOxNy layer) is deposited by CVD and thus a channel protection layer is prepared by photolithography and etching, and a via hole is etched in the protection layer simultaneously.

5. A pixel electrode layer (e.g., an ITO conductive thin film) is deposited by magnetic sputtering, a pixel electrode pattern is formed by photolithography and etching, and the pixel electrode is connected with, for example, the drain electrode, through the via hole.

The TFT structure formed through the above processes is of the follow features: the structure is simple and is relatively easy to be manufactured; the processes used for forming each layer are relatively simple; and the yield is relatively high. For example, it is possible to use a 6mask process, a 5mask process, a 4mask process and even a 3mask process (in the processes, one mask corresponds to one photolithography and etching) to perform the formation and the required equipments are not needed to be changed.

However, as the market for TFT-LCD televisions is expanding and the generation of the production line has been advanced, the size of a panel is becoming lager and lager. The requirements for the panels with relatively larger size and used in a television are different from those for the panels with relatively small size and used in a computer monitor. Increase of the size of a panel requires increase of the length of the gate lines and the data lines, and the total resistance of the lines increases, which results in retardation of signal and therefore causes the problems such as cross-talk and non-uniform brightness in the horizontal direction.

For the panels with a larger size and used in a television, the materials currently used for the source and drain electrodes to substitute the high resistance refractory metals, such as Mo, Cr, and alloys thereof comprise Al or Al alloy. However, since the contact between an Al layer and a $N^+$ doping semiconductor layer is not good due to the large difference in work functions, a thin Mo layer is firstly deposited as a buffer layer on an underlying layer. In addition, in order to resolve the problem of the poor contact between the pixel electrode and the Al layer, a thin Mo layer is deposited on the Al layer. With above configuration, not only the problem of large contact resistance of the Al layer with the ITO thin film but also the problem that hillocks are generated when pure Al is heated is resolved. However, the following disadvantages accompany the above advantages when such sandwich structure is employed.

1. The problems with respect to etching occur, for example, the source and drain electrodes are prone to break, the reason of which is a difference between etching rates of the intermediate Al layer and the underlying and overlying Mo metal layers.

2. The productivity is decreased, because three layers of two kinds of metals are needed to be deposited, which increases the deposition period compared with depositing only one kind of metal.

3. The cost is increased, because the current market price of Mo is greatly higher than that of Al.

SUMMARY OF THE INVENTION

The present invention is directed to the defects in the above mentioned conventional technology and provides a thin film transistor for a TFT-LCD and a method of manufacturing thereof. By modifying the configuration of the source and drain electrodes and the method of manufacturing the same, the defects such as that the source and drain electrodes are prone to break can be overcome, thus the productivity is increased and the production cost is reduced.

One aspect of the invention provides a thin film transistor. The thin film transistor comprises a gate electrode, a gate insulating layer, an active layer, and source and drain electrodes. The gate electrode overlaps with a channel region of the active layer, the gate insulating layer is provided between the gate electrode and the active layer, the source and drain electrodes overlap a source region and a drain region of the active layer, respectively, and a thin film of $SiN_x$ or $SiO_xN_y$ through which electrons are allowed to tunnel is provided between the active layer and the source and drain electrodes.

The second aspect of the invention provides a method of manufacturing a thin film transistor. The method comprises forming a gate electrode, a gate insulating layer, an active layer, and source and drain electrodes. The gate electrode overlaps with a channel region of the active layer, the gate insulating layer is formed between the gate electrode and the active layer, the source and drain electrodes overlap a source region and a drain region of the active layer, respectively, and a thin film of $SiN_x$ or $SiO_xN_y$ through which electrons are allowed to tunnel is provided between the active layer and the source and drain electrodes.

The third aspect of the invention provides a thin film transistor display. The thin film transistor display comprises a thin film transistor as a switching element of a pixel unit, the thin film transistor comprising a gate electrode, a gate insulating layer, an active layer, and source and drain electrodes. The gate electrode overlaps with a channel region of the active layer, the gate insulating layer is provided between the gate electrode and the active layer, the source and drain electrodes overlap a source region and a drain region of the active layer, respectively, and a thin film of $SiN_x$ or $SiO_xN_y$ through which electrons are allowed to tunnel is provided between the active layer and the source and drain electrodes.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DESCRIPTION OF THE PREFERRED EMBODIMENTS

Figure 1:
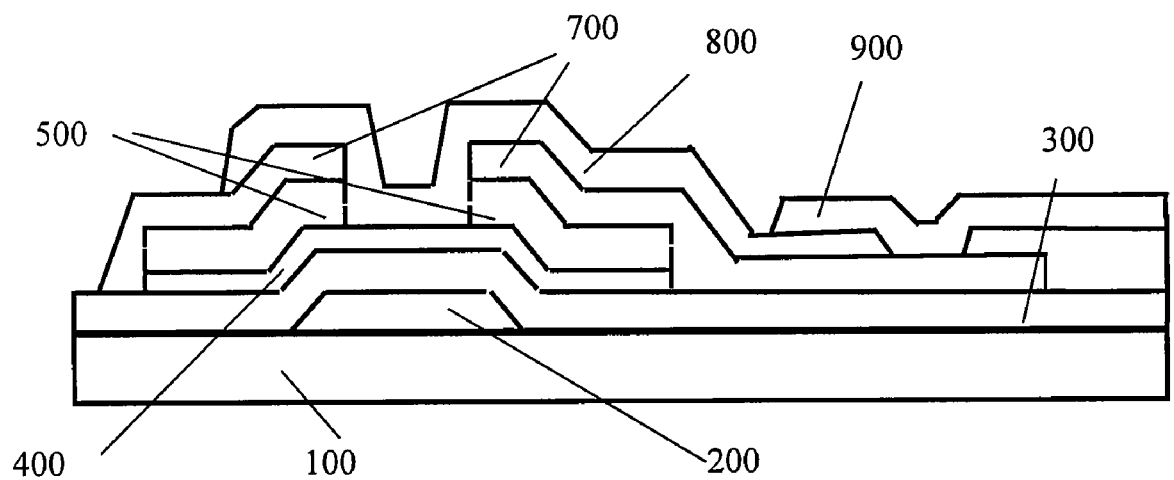
FIG. 1 is a schematic cross-sectional view of a conventional bottom gate thin film transistor (TFT) structure.
Figure 2:
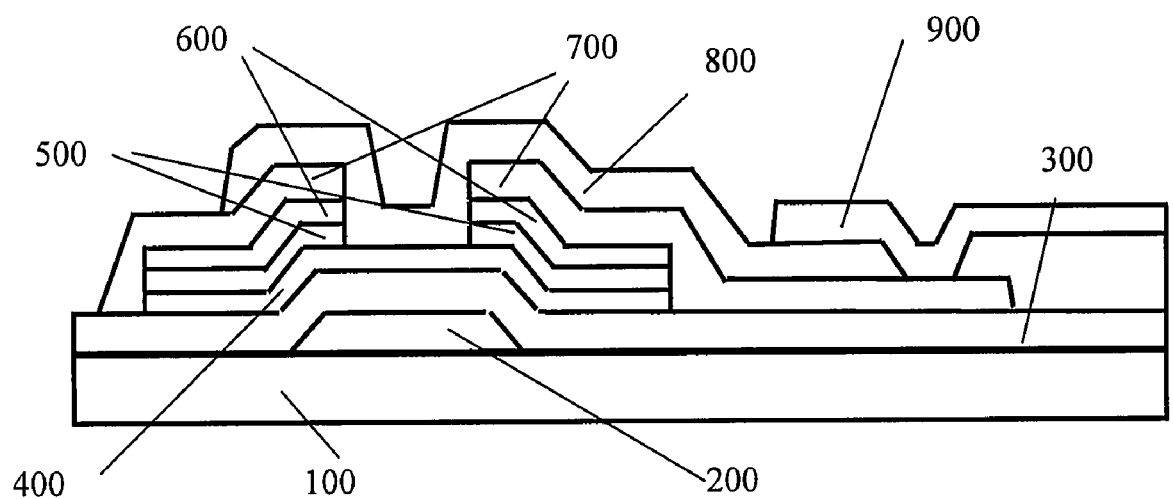
FIG. 2 is a schematic cross-sectional view of a thin film transistor according to an embodiment of the invention.
Figure 3:
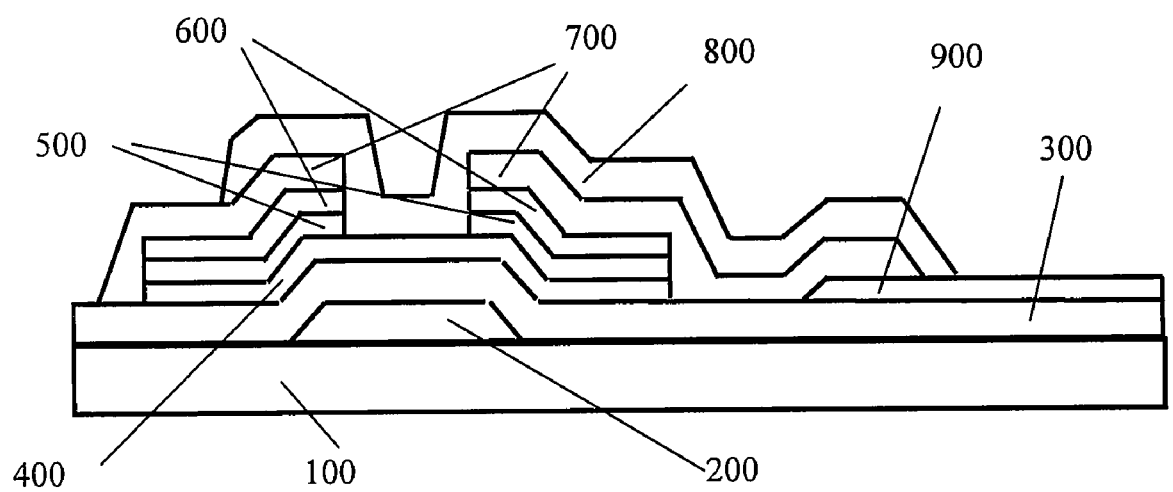
FIG. 3 is a schematic cross-sectional view of another thin film transistor according to the embodiment of the invention.

FIG. 2 is a schematic cross-sectional view of a thin film transistor according to an embodiment of the invention; and FIG. 3 is a schematic cross-sectional view of another thin film transistor according to the embodiment of the invention.

As shown in FIG. 2, the thin film transistor according to the embodiment of the invention comprises a substrate 100 and a gate 200, a gate insulating layer 300, a semiconductor layer 400, a doped semiconductor layer 500, source and drain electrodes 700, a passivation layer 800, and a pixel electrode 900, which are formed on the substrate 100 in order from the bottom. The pixel electrode 900 may be connected with one (e.g., the drain electrode) of the source and drain electrodes 700 through a via hole formed in the passivation layer 800. The semiconductor layer 400 and the doped semiconductor layer 500 are used to constitute an active layer of the thin film transistor. The doped semiconductor layer 500 may also be referred to as an ohmic contact layer, which is used to reduce the contact resistance between the semiconductor layer and the source and drain electrodes and may comprises other materials such as microcrystal silicon. In another embodiment, the pixel electrode 900 may also be directly lapped on one of the source and drain electrodes 700, as shown in FIG. 3. In the thin film transistor according to the embodiment of the invention, the source and drain electrodes 700 overlap with the active layer at its source and drain regions, respectively. A layer 600 of $SiN_x$ or $SiO_xN_y$ with a thickness, for example, of about 8-15 nm, is provided between the doped semiconductor layer 500 (or the active layer) and both of the source and drain electrodes 700. The material for the source and drain electrodes comprises Al alloy, which replaces the conventional pure Al or the multiple layer structure such as Al/Mo, Mo/Al/Mo and the like that is used as the material for the source and drain electrodes. The Al alloy are, for example, a binary alloy such as AlNd, AlTa, AlNi, AlZr and AlCu and the like, and may also be other alloys such as AlNdNi.

In the embodiment of the invention, since Al alloy is employed for replacing the pure Al material and the source and drain electrodes of the TFT may be formed by magnetic sputtering, the Mo layer is no longer needed to be deposited on the top of the source and drain electrodes. Since the contact between the Al alloy layer and the pixel electrode (an ITO conductive thin film) is good, the deposition of the overlaying Mo layer may be omitted. Due to the above techniques, the problems with respect to the etching of the source and drain electrodes, for example, the tilt angle of the etched layer, may be resolved.

In addition, in the embodiment of the invention, the underlying layer of Mo is also not deposited and replaced by a $SiN_x$ or $SiO_xN_y$ thin film with a thickness of about 8-15 nm. Although the $SiN_x$ or $SiO_xN_y$ thin film is insulating, since such thin film is very thin, for example, about 8-15 nm, the underlying source and drain electrodes may be connected with the pixel electrode to enable electric conduction by tunneling effect of electrons. Due to the above techniques, the problem of the reduced productivity results from the deposition of the multiple metal layers during manufacturing of the source and drain electrodes in the conventional technology can be resolved. Furthermore, since there is no need for depositing the overlying and underlying Mo layers, the cost for the raw materials of the source and drain electrodes is reduced. At the same time, the thin film of $SiN_x$ or $SiO_xN_y$, which replaces the underlying Mo layer, can be easily deposited by CVD, after the deposition of the doped semiconductor layer, in the same reaction chamber, which simplifies the manufacturing process.

Furthermore, the bottom gate thin film transistor of the above embodiment is not limited to the structures shown in FIGS. 2 and 3, for example, the order of the source and drain electrodes and the active layer can be reversed. That is to say, the source and drain electrodes are on the gate insulating layer, and a semiconductor layer and a doped semiconductor layer are sequentially formed on the source and drain electrodes. A thin film of $SiN_x$ or $SiO_xN_y$ with a thickness, for example, of about 8-15 nm, is provided between the doped semiconductor layer and the source and drain electrodes. The material of the source and drain electrodes comprises Al alloy.

The thin film transistor according to the embodiment of the invention may also be a top-gate type. Also, a semiconductor layer and a doped semiconductor layer constitute an active layer, and the doped semiconductor layer is connected with source and drain electrodes with a thin film of $SiN_x$ or $SiO_xN_y$ with a thickness, for example, of about 8-15 nm therebetween. The material of the source and drain electrodes comprises Al alloy.

The embodiment of the invention also provides a TFT-LCD with the above thin film transistor as a switching element of a pixel unit.

The embodiment of the invention also provides a method of manufacturing a thin film transistor and a method of manufacturing a TFT-LCD. For example, it will be described by way of manufacturing the bottom gate thin film transistor.

First Embodiment

1. A metal thin film is deposited on a substrate (e.g., a glass or a single crystal silicon wafer) for example by magnetic sputtering, and the target material for depositing the metal thin film comprises Al alloy; and a gate line and a gate electrode pattern are formed by photolithography and etching.

2. A thin film of $SiN_x$ or $SiO_xN_y$ is prepared by chemical vapor deposition (CVD) as a gate insulating layer. A semiconductor layer (e.g., an a-Si layer) and doped semiconductor layer (e.g., an $N^+$ a-Si layer) are deposited in a same process on the gate insulating layer by CVD.

3. In the same reaction chamber as that used in the step 2, a thin film of $SiN_x$ or $SiO_xN_y$ with a thickness of about 10 nm is formed by CVD, and a channel is formed by photolithography and dry etching.

4. A metal layer of Al alloy is deposited on the substrate formed in the step 3 by magnetic sputtering, and the source and drain electrodes are formed by photolithography and etching. The formed source and drain electrodes establish good contact with the doped semiconductor layer with the thin film of $SiN_x$ or $SiO_xN_y$ formed in the above step, respectively.

5. A passivation layer (e.g., $SiO_xN_y$) is deposited by CVD and thus a channel protection layer is prepared by photolithography and etching, and a via hole is etched in the protection layer simultaneously.

6. A transparent pixel thin film (e.g., ITO) is deposited by magnetic sputtering, a pixel electrode pattern is formed by photolithography and etching, and the pixel electrode is connected with one (e.g., the drain electrode) of the source and drain electrodes through the via hole.

Thus a pixel unit of the TFT-LCD is completed, and the formed thin film transistor is shown in FIG. 2.

Second Embodiment

Another method of manufacturing a pixel unit of a TFT-LCD and a thin film transistor is described in the following in reference to the accompanying drawings.

1. A metal thin film is deposited on a substrate (e.g., a glass or a single crystal silicon wafer) for example by magnetic sputtering, and the target material for depositing the metal thin film comprises Al alloy; a pattern of a gate line and a gate electrode are formed by photolithography and etching.

2. A thin film of $SiN_x$ or $SiO_xN_y$ is prepared by chemical vapor deposition (CVD) as a gate insulating layer. A semiconductor layer (e.g., an a-Si layer) and a doped semiconductor layer (e.g., an $N^+$ a-Si layer) are deposited sequentially on the gate insulating layer by CVD.

3. In the same reaction chamber as in the step 2, a thin film of $SiN_x$ or $SiO_xN_y$ with a thickness of about 10 nm is formed by CVD, and a silicon island is formed by photolithography and dry etching.

4. A pixel electrode thin film (e.g., an ITO thin film) is deposited for example by magnetic sputtering, a pattern of a pixel electrode is formed by photolithography and etching.

5. A metal layer of Al alloy is deposited on the above pattern for example by magnetic sputtering, and source and drain electrodes are formed by photolithography and etching. The formed source and drain electrodes establish good contact with the doped semiconductor layer with the thin film of $SiN_x$ or $SiO_xN_y$ layer formed in step 3, respectively. At the same time, the source and drain electrodes are connected with the pixel electrode and establish good contact therebetween.

6. The doped semiconductor layer and the thin film of $SiN_x$ or $SiO_xN_y$ are etched to form a channel.

7. A passivation layer (e.g., $SiO_xN_y$) is deposited by CVD and thus a channel protection layer is prepared by photolithography and etching.

Thus a pixel unit of the TFT-LCD is completed, and the formed thin film transistor is shown in FIG. 3.

Compared with the conventional technology, the embodiments of the present invention modify the conventionally used multiple-layer source and drain electrodes into a single layer ones, resolving the etching problems due to the multiple metal layers configuration. The problems comprise that, for example, the source and drain electrodes are prone to break, the reason of which is a difference between the etching rates of the intermediate Al metal layer and the overlying and underlying Mo metal layers. In addition, deposition of a three-layer structure of two kinds of metals needs a relatively longer deposition period and leads to relatively low productivity. With respect to these problems, the embodiments of the invention deposit one kind of metal to form the source and drain electrodes, which enhances the productivity. Since the embodiments of the invention only deposit one layer of metal, the number of the chambers for magnetic sputter is reduced, which reduces the cost of equipment and maintenance. Further, since the market price of Mo is very high, the underlying and overlying Mo layers in the embodiments of the invention can be omitted and thus the cost of raw materials can be reduced. Finally, the embodiments of the invention maintain the low electrical resistance of Al metal.

The invention being thus described, it will be obvious that the same may be varied in many ways. Such variations are not to be regarded as a departure from the spirit and scope of the invention, and all such modifications as would be obvious to those skilled in the art are intended to be comprised within the scope of the following claims.

What is claimed is:

1. A thin film transistor, comprising:
    a gate electrode, a gate insulating layer, an active layer, and source and drain electrodes,
    wherein the gate electrode overlaps with a channel region of the active layer, the gate insulating layer is provided between the gate electrode and the active layer, the source and drain electrodes overlap a source region and a drain region of the active layer, respectively, and a thin film of SiNx or SiOxNy through which electrons are allowed to tunnel between the active layer and the source electrode and between the active layer and the drain electrode, is provided between the active layer and the source electrode and between the active layer and the drain electrode, respectively.

2. The thin film transistor of claim 1, wherein the thin film of SiNx or SiOxNy has a thickness of about 8-15 nm.

3. The thin film transistor of claim 1, wherein a material of the source and drain electrodes comprises Al alloy.

4. The thin film transistor of claim 3, wherein the Al alloy is selected from the group consisting of AlNd, AlTa, AlNi, AlZr, AlCu, and AlNdNi.

5. The thin film transistor of claim 1, wherein the thin film transistor is a bottom gate thin film transistor.

6. The thin film transistor of claim 1, wherein the active layer comprises a semiconductor layer and an ohmic contact layer that are stacked together, and the thin film of SiNx or SiOxNy through which electrons are allowed to tunnel is provided between the ohmic contact layer and the source electrode and between the ohmic contact layer and the drain electrodes, respectively.

7. The thin film transistor of claim 6, wherein the ohmic contact layer is a doped semiconductor layer or a microcrystal silicon layer.

8. A thin film transistor liquid crystal display, comprising a thin film transistor as a switching element of a pixel unit, wherein the thin film transistor comprises:

a gate electrode, a gate insulating layer, an active layer, and source and drain electrodes, wherein the gate electrode overlaps with a channel region of the active layer, the gate insulating layer is provided between the gate electrode and the active layer, the source and drain electrodes overlap a source region and a drain region of the active layer, respectively, and a thin film of SiNx or SiOxNy through which electrons are allowed to tunnel between the active layer and the source electrode and between the active layer and the drain electrode, is provided between the active layer and the source electrode and between the active layer and drain electrode, respectively.

9. The thin film transistor liquid crystal display of claim 8, further comprising a pixel electrode that is connected with one of the source and drain electrodes.

10. The thin film transistor liquid crystal display of claim 8, wherein the pixel electrode is connected with one of the source and drain electrodes through a via hole.

* * * * *